(12) United States Patent
Bergendahl et al.

(10) Patent No.: US 7,353,487 B1
(45) Date of Patent: Apr. 1, 2008

(54) REGIONAL SIGNAL-DISTRIBUTION NETWORK FOR AN INTEGRATED CIRCUIT

(75) Inventors: Jason R. Bergendahl, Sunnyvale, CA (US); Ping-Chen Liu, Fremont, CA (US); Paul T. Sasaki, Sunnyvale, CA (US); Suresh M. Menon, Sunnyvale, CA (US); Atul V. Ghia, San Jose, CA (US); Steven P. Young, Boulder, CO (US); Trevor J. Bauer, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 527 days.

(21) Appl. No.: 10/981,877

(22) Filed: Nov. 5, 2004

Related U.S. Application Data

(60) Provisional application No. 60/608,552, filed on Sep. 10, 2004.

(51) Int. Cl.
G06F 17/50 (2006.01)
(52) U.S. Cl. .............................. 716/17; 716/16; 716/18
(58) Field of Classification Search ............ 716/16–19; 326/39–41
See application file for complete search history.

(56) References Cited

U.S. PATENT DOCUMENTS

| | | | | |
|---|---|---|---|---|
| 5,712,579 A | * | 1/1998 | Duong et al. ................. | 326/93 |
| 5,914,616 A | * | 6/1999 | Young et al. .................. | 326/41 |
| 6,996,736 B1 | * | 2/2006 | Nguyen et al. ............. | 713/500 |
| 7,091,890 B1 | | 8/2006 | Sasaki et al. | |
| 7,129,765 B2 | | 10/2006 | Vadi et al. | |
| 7,145,362 B1 | * | 12/2006 | Bergendahl et al. .......... | 326/47 |
| 7,187,200 B2 | | 3/2007 | Young | |

OTHER PUBLICATIONS

Xilinx Inc.; "Virtex II Pro Platform FPGA Handbook"; Oct. 14, 2002; ; pp. 19-71, available from Xilinx, inc., 2100 Logic Drive, San Jose, California 95124.

Xilinx Inc.; "Programmable Logic Data Book 2000"; Copyright 2000; pp. 3-75 thru 3-96, available from Xilink, Inc., 2100 Logic Drive, San Jose, California 95214.

* cited by examiner

*Primary Examiner*—Stacy A Whitmore
*Assistant Examiner*—Magid Y. Dimyan
(74) *Attorney, Agent, or Firm*—W. Eric Webostad

(57) ABSTRACT

Signal distribution of a regional signal is described. A programmable logic device includes a global signal distribution network, a regional signal distribution network and a regional buffer. The regional buffer has an output coupled at an end of the regional signal distribution network. The regional signal distribution network is coupled to a configurable logic block via an interconnect tile. The regional buffer is coupled to a regional clock capable input/output block. Additionally described is a source synchronous interface for regional signal distribution.

6 Claims, 11 Drawing Sheets

REGIONAL SIGNAL-DISTRIBUTION NETWORK FOR AN INTEGRATED CIRCUIT

CROSS-REFERENCE

This application claims priority from and incorporates by reference U.S. provisional application Ser. No. 60/608,552, entitled "REGIONAL SIGNAL-DISTRIBUTION NETWORK FOR AN INTEGRATED CIRCUIT", by Jason Bergendahl, et al., filed Sep. 10, 2004.

FIELD OF THE INVENTION

One or more aspects of the invention relate generally to signal distribution and more particularly, to a regional clock-distribution network in an integrated circuit.

BACKGROUND OF THE INVENTION

In the design of a clock-distribution network, or "clock tree," for an integrated circuit (IC) such as application specific integrated circuit (ASIC) or a Programmable Logic Device (PLD) some of the major considerations are skew, jitter, delay, duty cycle distortion and power consumption. Various clock tree geometries such as the balanced tree (e.g., the H clock tree) and grid have been used. The H clock tree, in some cases, can provide low clock skew.

In addition to clock tree geometry, a clock tree may be differential, i.e., provide a differential clock signal using differential circuits, or may be single-ended, i.e., a single clock signal using the conventional Complementary Metal Oxide Semiconductor (CMOS) circuits. A single-ended clock tree is typically noisy and prone to duty cycle distortion at high frequencies, but has only dynamic power consumption. On the other hand, while a differential clock tree has good noise immunity and low duty cycle distortion, it consumes static power due to a common mode.

Traditionally, a PLD has used a single ended clock tree. A PLD, for example, a Field Programmable Gate Array (FPGA) such as the Virtex™-II from Xilinx Inc. of San Jose, Calif., receives a single ended clock or differential signal via the ring of IOBs on the perimeter of the FPGA and transfers this clock signal to configurable logic blocks (CLBs) via the single ended clock tree.

As clock speeds for ICs increase, the need for a low noise clock such as a differential clock increased; however, the single ended clock still has advantages, such as lower static power consumption.

Heretofore, there were two principal ways of distributing a clock signal in a PLD, namely, "local" clock-distribution networks and "global" clock-distribution networks. A global clock-distribution network or global clock resource is classically a centralized clock-distribution network. A clock signal driven on a global clock resource may be capable of reaching any clocking point of a PLD. An H clock tree is conventionally used to provide a global clock resource. However, due to the wide span of a global clock-distribution network, they are relatively expensive in terms of semiconductor die area and metallization usage.

In contrast to global clock-distribution networks, local clock-distribution networks are not formed as dedicated clock resources, but rather are instantiated by configuring general-purpose programmable interconnect resources of a PLD. In the past, local clock-distribution networks were used for localized clock distribution as well as providing a signal externally to the PLD. Examples of prior applications of local clock-distribution networks include without limitation providing a source synchronous clock signal for a synchronous interface and receiving a forwarded clock signal for a synchronous interface. As used herein, a source synchronous interface is where a clock signal, such as may be referred to as a "source clock", "forwarded clock" or "IO clock", is provided with one or more associated data signals from a source to a destination. However, a local clock-distribution network is generally less predictable with respect to timing characteristics, including without limitation skew, of a propagated signal thereon than a global clock-distribution network. This difficulty in predictability makes using a local clock-distribution network for timing sensitive applications, such as telecommunications, networking and memory applications with synchronous interfaces, more problematic.

Accordingly, it would be desirable and useful to provide a clock-distribution network that has improved timing predictability over that of a local clock-distribution network, but is not as costly as a global clock-distribution network.

SUMMARY OF THE INVENTION

One or more aspects of the invention relate generally to regional signal distribution.

An aspect of the invention is an integrated circuit, including: a global signal distribution network; at least one regional signal distribution network; and a regional buffer having an output coupled at an end of the at least one regional signal distribution network. The at least one regional signal distribution network is coupled to at least one configurable logic block, and the regional buffer is coupled to at least one regional clock capable input/output block.

An aspect of the invention is a source synchronous interface for receiving a forwarded clock signal, including: an input buffer for receiving the forwarded clock signal; and a regional buffer coupled to the input buffer to receive the forwarded clock signal as buffered by the input buffer, where the regional buffer is configured to divide frequency of the forwarded clock signal by an integer value greater than one to provide a divided clock signal.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items, however, in alternative embodiments the items may be different.

Moreover, regional signal-distribution networks, as described herein, are dedicated resources that allow for signal distribution within a limited region of an integrated circuit. Although the description that follows is in terms of a PLD such as an FPGA and distribution of a clock signal, it should be understood that any integrated circuit of sufficient complexity may include a regional signal-distribution network as described herein and any digital signal may be distributed using a regional signal-distribution network as described herein.

Additionally, references to direction in terms of vertical (y-planar axis) or horizontal (x-planar axis) are for clarity with respect to the referenced drawings, and actual implementation may assume other directionalities.

Programmable Logic Devices

Figure 1:
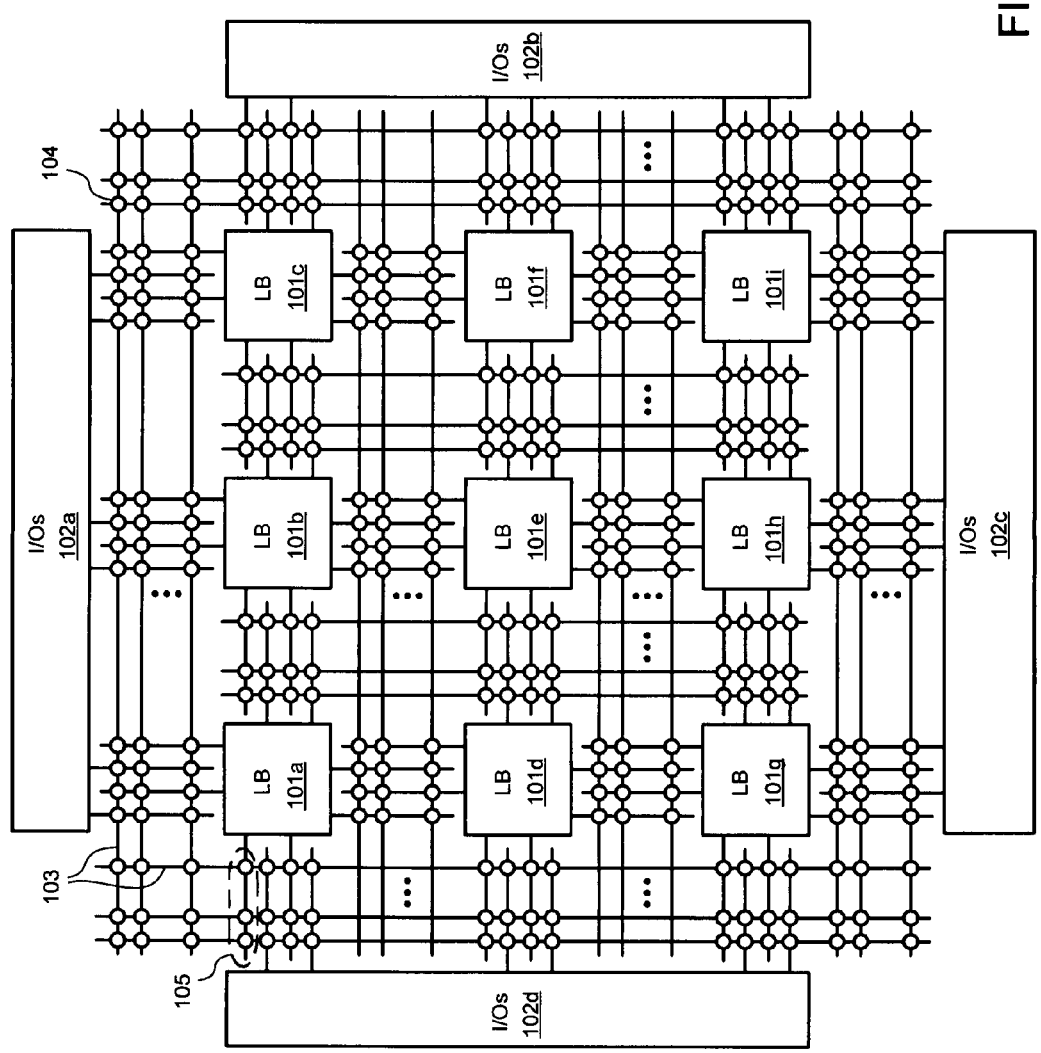
FIG. 1 is a simplified block diagram depicting a prior art Field Programmable Gate Array ("FPGA").

FIG. 1 is a simplified illustration of an exemplary FPGA. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines", which is incorporated herein by reference in its entirety.

One such FPGA, the Xilinx Virtex®-II FPGA, is described in detail in pages 33-75 of the "Virtex-II Platform FPGA Handbook", published December, 2000, available from Xilinx, Inc., 2100 Logic Drive, San Jose, Calif. 95124.

One such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124.

As FPGA designs increase in complexity, they reach a point at which the designer cannot deal with the entire design at the gate level. Where once a typical FPGA design comprised perhaps 5,000 gates, FPGA designs with over 100,000 gates are now common. To deal with this complexity, circuits are typically partitioned into smaller circuits that are more easily handled. Often, these smaller circuits are divided into yet smaller circuits, imposing on the design a multi-level hierarchy of logical blocks.

Libraries of predeveloped blocks of logic have been developed that can be included in an FPGA design. Such library modules include, for example, adders, multipliers, filters, and other arithmetic and DSP functions from which complex designs can be readily constructed. The use of predeveloped logic blocks permits faster design cycles, by eliminating the redesign of duplicated circuits. Further, such blocks are typically well tested, thereby making it easier to develop a reliable complex design.

Some FPGAs, such as the Virtex FGPA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, digital signal processing functions, memories, storage elements, and math functions. Some cores include an optimally floorplanned layout targeted to a specific family of FPGAs. Cores can also be parameterizable, i.e., allowing the user to enter parameters to activate or change certain core functionality.

Figure 2:
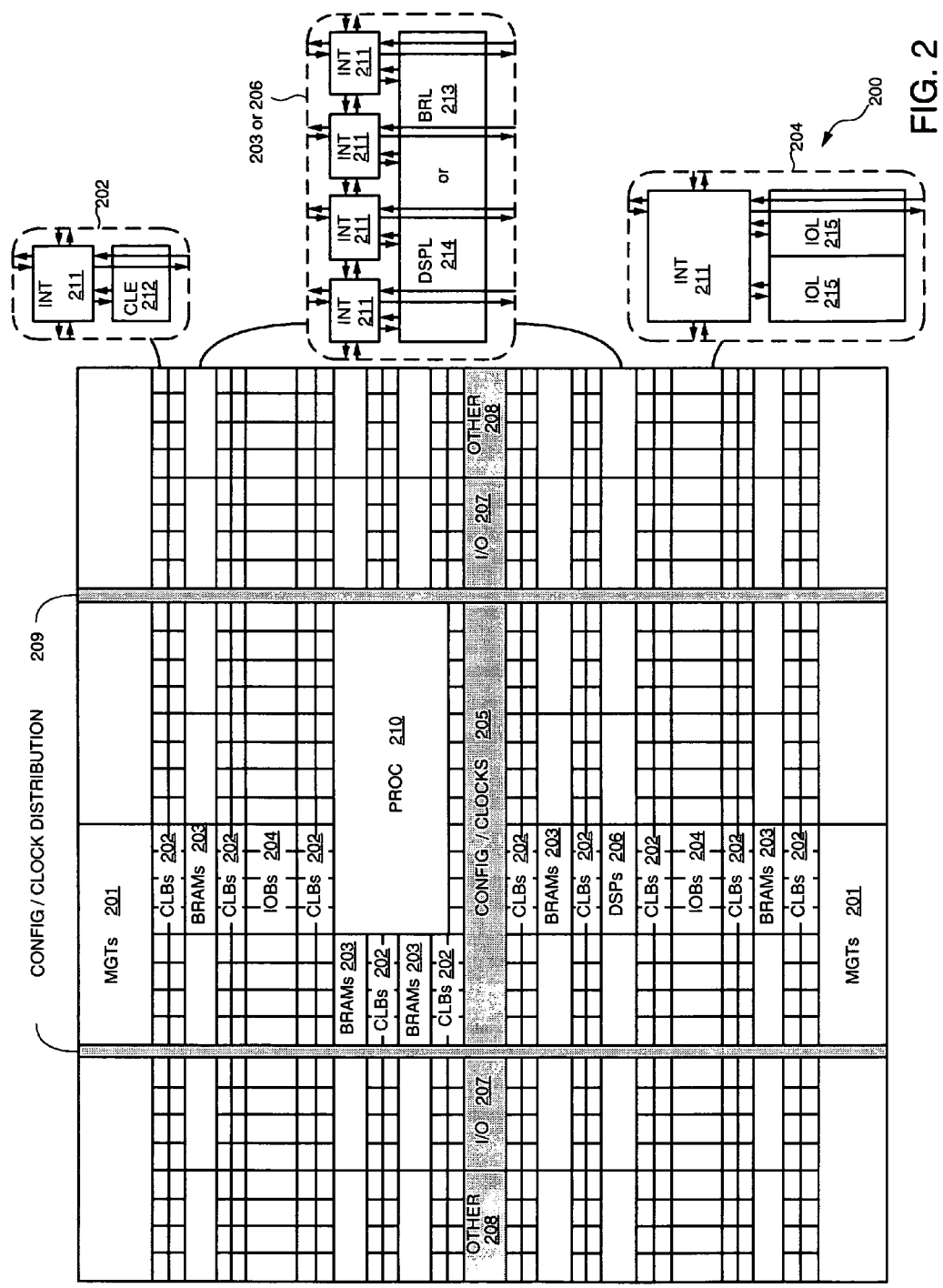
FIG. 2 is a simplified block diagram of an FPGA of an embodiment of the present invention.

FIG. 2 illustrates an FPGA architecture 200 of embodiment of the present invention that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. The FPGA may also include dedicated processor blocks (PROC 210).

In the above FPGA, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic. Another exemplary FPGA is disclosed in co-pending U.S. patent application entitled, "Columnar Architecture" by Steve P. Young, filed Oct. 10, 2003, Ser. No. 10/683,944, which is herein incorporated by reference.

Clock Regions

Figure 3:
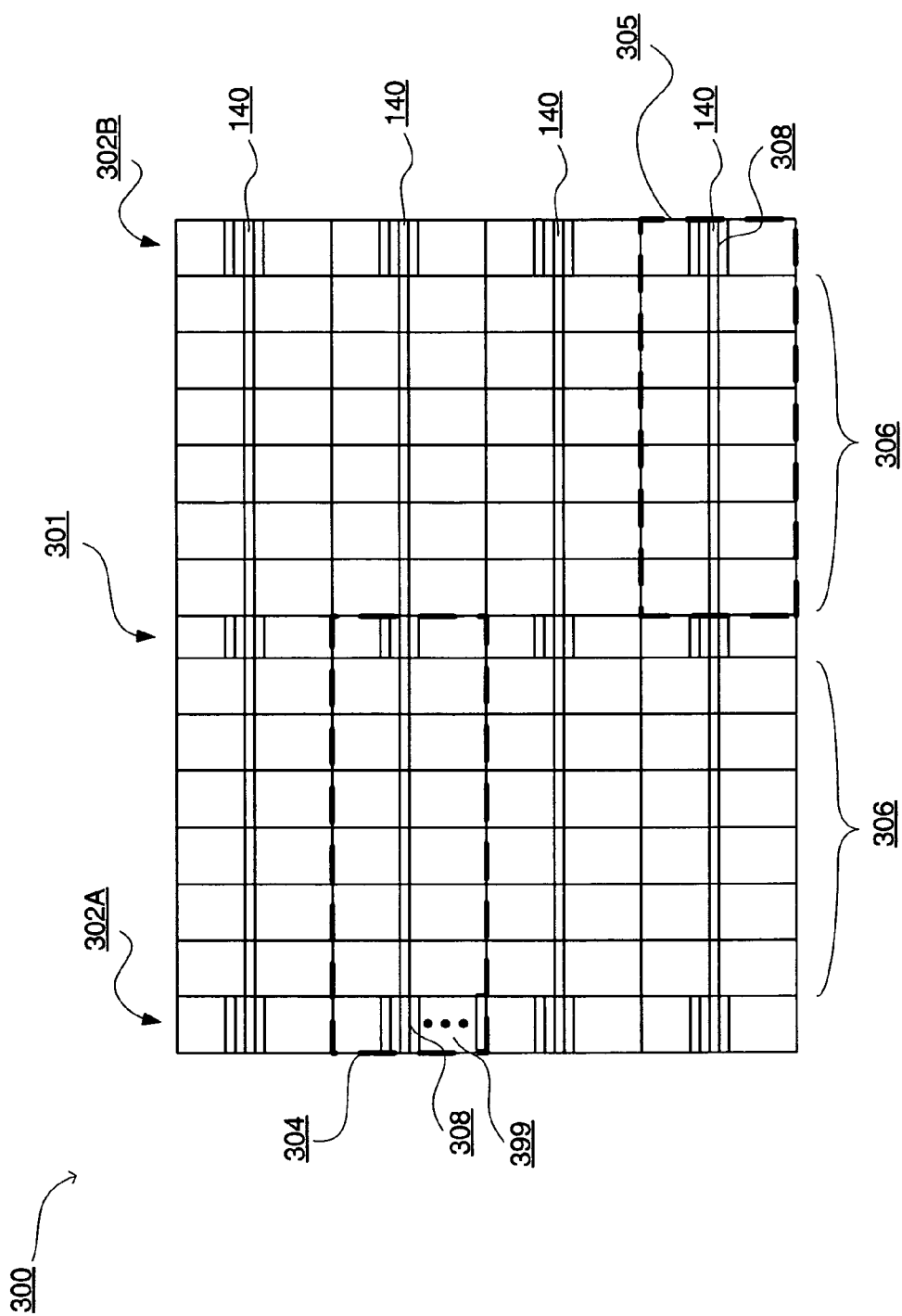
FIG. 3 is a simplified block diagram depicting an exemplary embodiment of a floor plan for a portion of an FPGA.

FIG. 3 is simplified block diagram depicting an exemplary embodiment of a floor plan for a portion of an FPGA 300. FPGA 300 includes columns of IOs 301, 302A and 302B (columns of IOs 302A and 302B are collectively and singly referred herein under the reference number 302), as well as other columns 306 of logic blocks described elsewhere herein. The number of logic blocks that a regional clock region 304 or 305 (dotted rectangle) horizontally spans is not limited to the seven or eight blocks illustratively shown, but may be fewer or more than the exemplary number of blocks illustratively shown. Moreover, the number of logic blocks that a regional clock region 304 or 305 vertically spans is not limited to the two blocks illustratively shown, but may be fewer or more than the exemplary number of blocks illustratively shown. Notably, in this embodiment, each block 399 respectively represents 16 IOBs, though fewer or more IOB may be used.

Regional clock regions ("clock regions") 304 and 305 are defined within FPGA 300. Notably, clock region 304 includes portions of IO columns 301 and 302, and clock region 305 includes a portion of IO column 302 and does not include a portion of IO column 301. This delineation is merely by convention to avoid overlapping for an odd number of IO columns. Thus for example, a left side clock region 304 has a clock skew property that includes signal propagation to IO column 301, which thus may be longer than the clock skew property of a right side clock region 305. Additionally, IO column 301 may be a center IO column of FPGA 300.

Rows 140 include global clock lines for horizontal distribution of global clock signals, such as hclk rows 140. Clock regions 304 and 305 are respective portions of FPGA 300. IO columns 301 and 302 include banks of IOBs. At locations where an hclk row 140 extends into an IO column, a global signal may be used to drive an IOB.

Notably, though a clock region may include a portion of a centrally disposed IO column 301, regional clock signals in contrast to global clock signals do not have to be broadcast from a central location of FPGA 300. In other words, a global clock signal is broadcast from a central location for enhancing uniformity of signal propagation delay. Moreover, regional clock signals do not have to be broadcast from a central location (x,y) of a regional clock region, such as clock regions 304 and 305. For example, a regional clock signal in some implementations may not propagate as far as a global clock signal, and thus may have a lower possible maximum skew. Accordingly, a regional clock signal may be driven from one end of a clock region. In other words, a regional clock network is a decentralized clock resource, whereas a global clock network is a centralized clock resource.

Additionally, in contrast to a global clock network, a regional clock network may be scaled with an increase in the array dimension, and thus number of IOBs, whereas the global clock network may retain the same number of clock signal distribution paths as a semiconductor die is scaled. The total number of regions scales with the y-dimension, and the size of each region (i.e., the amount of logic within each region) scales with the x-dimension.

Figure 4:
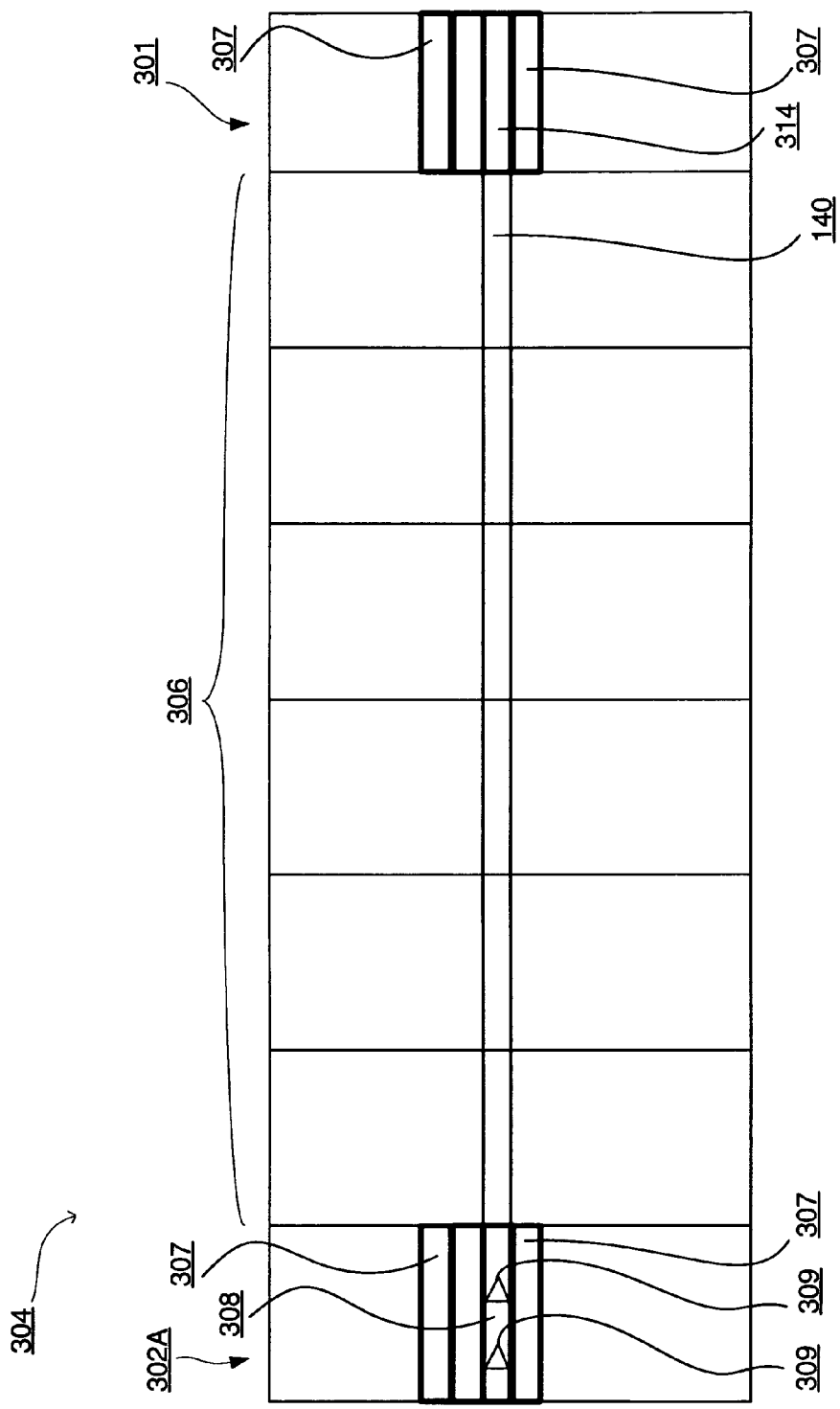
FIG. 4 is a simplified block diagram depicting an exemplary embodiment of a floor plan for clock region.

FIG. 4 is a simplified block diagram depicting an exemplary embodiment of a floor plan for clock region 304. Hclk IOB tile 308, which provides access to or is part of a global signal distribution network, includes two regional buffers 309 though fewer or more than two regional buffers 309 may be implemented. Regional buffers 309 are coupled to hclk row 140. Regional buffers 309 are in close proximity to IOBs of IO column 302 incoming clock and data signals. Thus, routing of an incoming clock signal for example to an input of a regional buffer 309 is facilitated.

Figure 5:
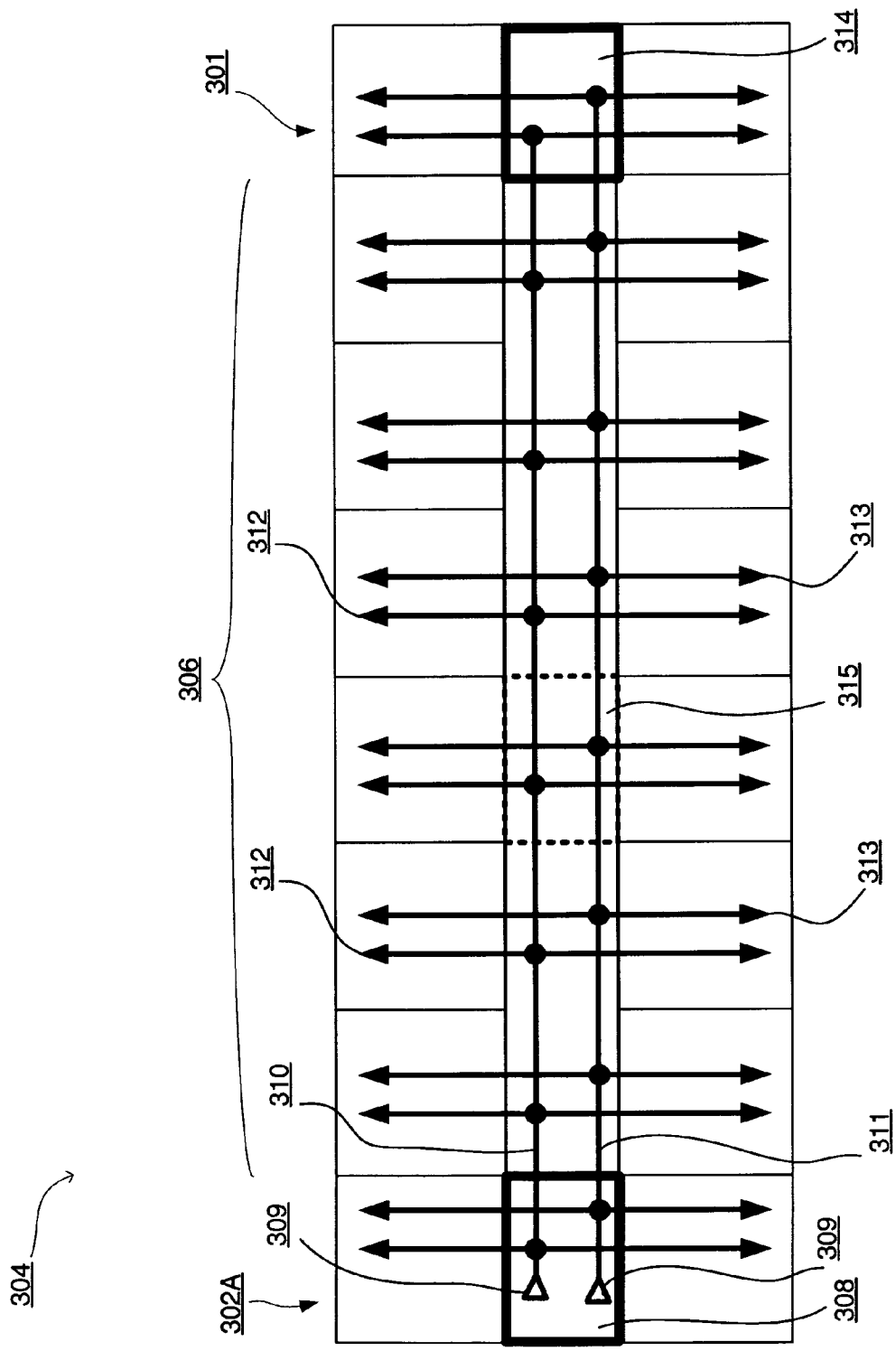
FIG. 5 is a simplified block/network diagram depicting an exemplary embodiment of signal lines for clock region.

FIG. 5 is a simplified block/network diagram depicting an exemplary embodiment of signal lines for clock region 304. From regional buffers 309 are driven signals onto respective horizontally disposed regional clock signal lines 310 and 311. Signal lines 310 and 311 extend from IO column 302 to IO column 301. Vertically disposed regional clock signal lines 312 are coupled to horizontally disposed signal line 310, and vertically disposed regional clock signal lines 313 are coupled to horizontally disposed signal line 311. Vertically disposed signal lines 312 and 313 each extend upwardly and downwardly within each respective column, namely, IO columns 301 and 302, as well as columns 306. Thus, by having regional buffers 309 drive signals onto signal lines 310 through 313 in combination an end-driven H clock tree is provided.

Notably, for IO column 301 being a center column, there are no regional buffers 309 disposed in hclk IOB tile 314 of IO column 301. This is different from IO clock networks having buffers for driving signals at left and right ends, as well as in the center, of a signal distribution network.

However, if regional buffers 309 are configured to be tri-statable, then a regional clock network could be driven from either end.

Notably, though two clock networks for each clock region are illustratively shown, it should be understood that fewer or more than two clock networks may be implemented. Accordingly, there may be more than two regional clocks within a regional clock region.

For a serial to parallel converter used for example in a source synchronous interface, serial data is conventionally received at a high rate of frequency from a source and converted to parallel data for processing at a lower rate of frequency. For an application in which the frequency of a received forwarded or source synchronous clock signal is unknown, such forwarded clock signal or IO clock may be divided down to provide a derivative or divided down clock. Regional buffers 309 may be used to assist in registering parallel data into programmable circuitry ("the programmable fabric") of FPGA 300. For example, an IO clock may be used to clock an initial stage of registers, and a frequency divided version of the IO clock may be used to clock at least in part one or more subsequent stages of registers. The divided down version of the IO clock used to clock such one or more subsequent stages of registers may be driven by one or more regional buffers 309. Further details regarding serial to parallel conversion for source synchronous interfacing may be found in the detailed co-pending U.S. patent application Ser. No. 10/919,901, entitled "Multi-Purpose Source Synchronous Interface Circuitry", by Paul T. Sasaki, et al., filed Aug. 17, 2004, which is incorporated by reference herein in its entirety.

Figure 6:
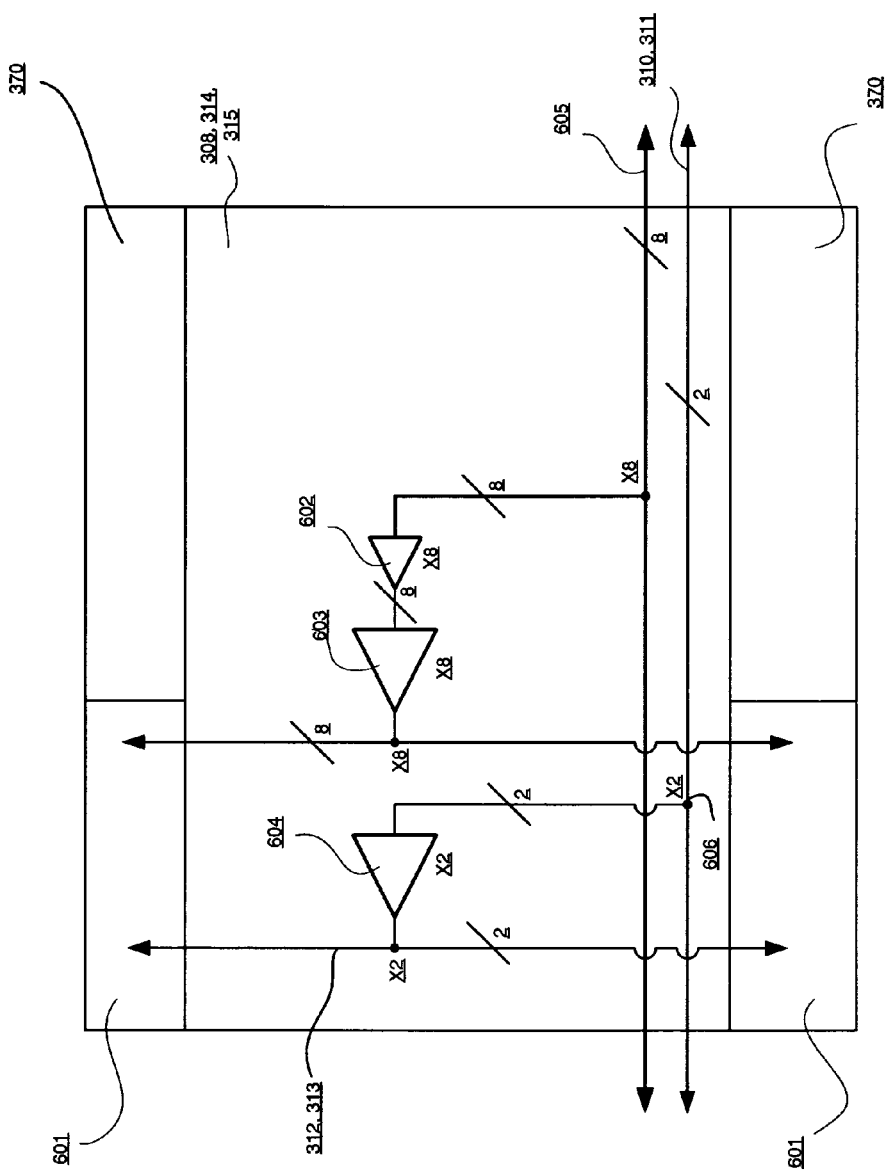
FIG. 6 is a simplified block/schematic diagram depicting an exemplary embodiment of a regional clock interface block.

FIG. 6 is a simplified block/schematic diagram depicting an exemplary embodiment of a regional clock interface block 308, 314 or 315. Regional clock interface block 308, 314 or 315 is a logic block of logic block columns 306 or IO column 301, respectively. I/O blocks 102 and 204 are illustratively shown in FIGS. 1 and 2, respectively.

Regional clock interface block 315, for example, is interconnected to a logic block of logic block columns 306 via programmable local interconnects provided via interconnect tiles 601. Interconnect tiles 601 conventionally have a plurality of general purpose resources, as well as separate sections for clock and control signals. As interconnect tiles 601 are well-known, they are not described herein in detail for purposes of clarity.

Notably, regional clock signal paths are connected the same, so only one signal path is particularly shown in FIG. 6 for purposes of clarity; however, such regional clock signal path is labeled to indicate that there are pluralities of signals and circuit elements. Moreover, global clock signal paths 605 are all connected in the same way, so only one signal path is particularly shown in FIG. 6 for purposes of clarity; however, such a global clock signal path is labeled to indicate that there are pluralities of signal and circuit elements. Thus, for regional signal distribution, there are N, for N an integer greater than one, clock signals. Moreover, there are M, for M an integer greater than one, global clock signals. In this example, for purposes of clarity and not limitation, N and M are respectively equal to 2 and 8.

Furthermore, regional clock signals are described herein as single-ended signals, such as rail-to-rail single-ended signals. However, regional clock signals may alternatively be differential signals, such as small swing differential signals, which are later converted to single-ended signals. If regional clock signals were differential, then for each signal there would be two signal wires or lines. Global clock signals are described herein as differential signals, such as small swing differential signals. Accordingly, for eight signals for example, there would be sixteen signal wires. However, for purposes of clarity, FIG. 6 indicates the number of signals and not signal wires.

To provide an improved clock-distribution network for ICs and in particular PLDs that better balances low noise and low power consumption, others have proposed a hybrid clock tree for global clock distribution, including further details regarding global clock signals and signal paths, which is described in a co-pending U.S. patent application Ser. No. 10/836,722 entitled "A Differential Clock Tree in an Integrated Circuit" by Vasisht M. Vadi, et al., filed Apr. 30, 2004, which is incorporated by reference herein in its entirety.

Horizontal regional clock signal lines 310 and 311 are tapped at leaf nodes 606. Each leaf node 606 is coupled to a respective buffer of buffers 604. The two buffers 604 receive a respective input signal and provide responsive thereto a respective output signal. The two outputs of buffers 604 are respectively connected to vertical regional clock signal lines 312 and 313. Notably, no multiplexing or cross-barring is needed, as a one-to-one correspondence may be used.

Vertical regional clock signal lines 312 and 313 extend within a regional clock interface block 315, namely, a tile of hclk row 140, and extend to respective interconnect tile blocks 601 above and below regional clock interface block 315. Interconnect tile blocks 601 respectively provide interconnectivity to respective logic blocks in a column of logic blocks, such as columns 301, 306. Thus, regional clock signal lines 310 and 311, which are "branches" of an end driven H clock tree, are leafed at "leaf" nodes 606 to provide "leaf" regional clock signal lines 312 and 313.

Eight global clock signals 605 are provided via hclk row 140 to eight differential to single-ended converter buffers 602, such as differential to CMOS signaling, to provide eight single-ended output signals. The eight single-ended outputs are respectively provided as inputs to eight buffers 603 to provide eight outputs. The eight outputs are provided to respective interconnect tile blocks 601 above and below regional clock interface block 315. Interconnect tile blocks 601 provide respective interconnectivity to respective logic blocks in a column of logic blocks, such as columns 301, 306. Leafing of global clock signal lines is described in the above cited co-pending U.S. patent application Ser. No. 10/836,722 entitled "A Differential Clock Tree in an Integrated Circuit", by Vasisht Mantra Vadi, et al. filed Apr. 30, 2004.

However, it should be appreciated that within a clock region, such as clock region 304 or 305 of FIG. 3, regional clock signals have the ability to reach all clocking locations or points that global clock signals can reach via interconnect tiles. In other words, a regional clock signal may be propagated to any clocking point in an interconnect tile in the clock region. Furthermore, because general-purpose interconnect tiles communicate signals from regional signal lines, such regional signal lines may be used for signals other than clock signals. For example, signals that have a relatively high fan out within a signal region, such as signal regions 304 or 305 of FIG. 3, where a limited skew is desirable, may use regional signal resources for distribution of such signals within such a signal region rather than using general-purpose interconnects. Furthermore, such signal distribution may extend to one or more neighboring signal regions as described below in additional detail.

Figure 7:
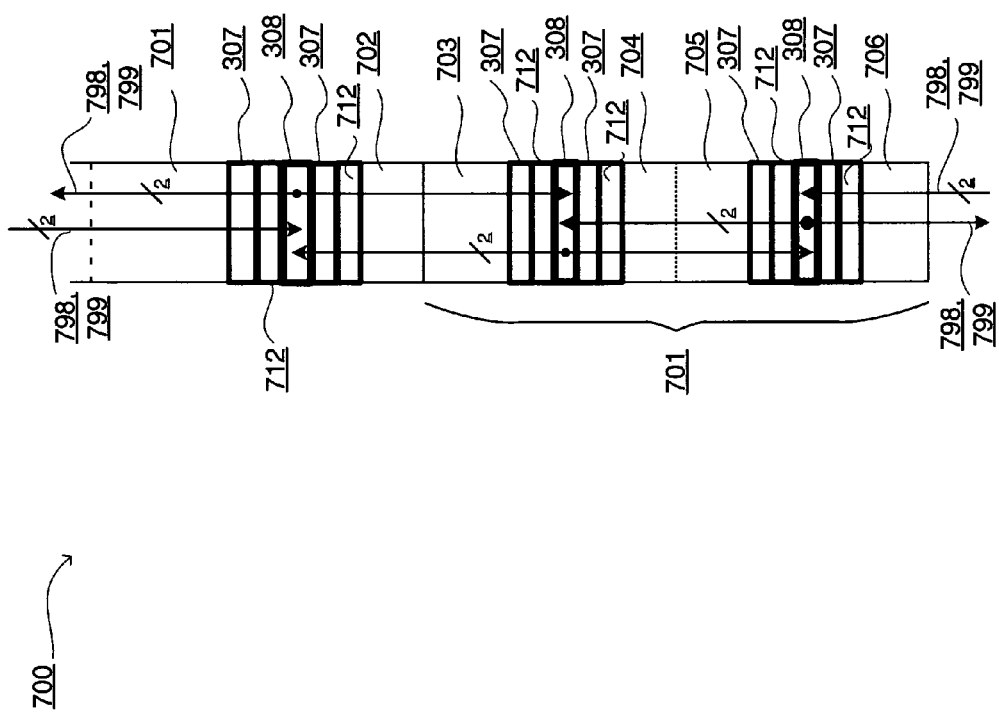
FIG. 7 is a simplified block diagram depicting an exemplary embodiment of a portion of an input/output ("IO") column.

FIG. 7 is a simplified block diagram depicting an exemplary embodiment of a portion 700 of an IO column 302 of FIG. 3. Portion 700 includes hclk IOB tiles 308. Located above and below each hclk IOB tile 308 is a regional clock capable IOB 307. Located below each regional clock capable IOB 307 is a respective IOB 712. IOBs 712 may be coupled to IOBs 307 for differential signaling. Accordingly, portion 700 includes a bank 701 of IOBs. There may be any of a variety of numbers of IOBs in bank 701, such as 64 IOBs for example. Notably, a global clock capable IOB is the same as other IOBs in the bank, except that provided is additional connectivity to a global signal distribution network. Moreover, a regional clock capable IOB is the same as other IOBs in the bank, except that provided is separate connectivity to a regional signal distribution network.

Vertical regional clock signal lines 798 and 799 extend vertically upward and downward from an hclk IOB tile 308, respectively. Vertical regional clock signal lines 798 and 799 extend from an hclk IOB tile 308 from which such signal lines originate to the next hclk IOB tiles 308 located above and below the hclk IOB tile 308 of origin. Thus, vertical regional clock signal lines 798 and 799 span a block of IOBs above and below an hclk IOB tile 308. Moreover, because such vertical regional clock signal lines 798 and 799 extend to a next hclk IOB tile, regional clock domains may be chained together via vertical regional clock signal lines 798 and 799 of an IO column. In an embodiment, a regional clock signal may drive multiple clock regions. For example, in an embodiment, a regional clock signal may drive up to three clock regions.

Figure 8:
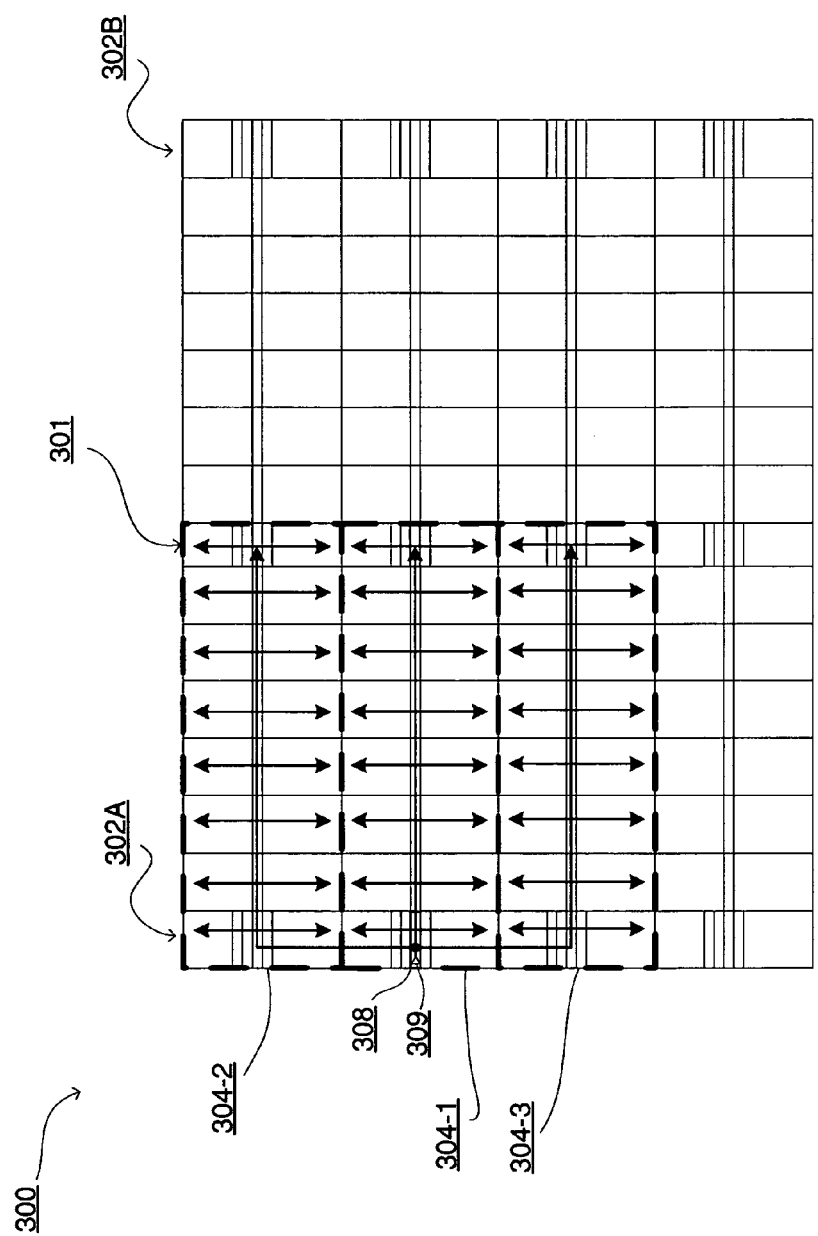
FIG. 8 is a simplified block/network diagram depicting an exemplary embodiment of signal lines for clock regions of the FPGA of FIG. 3.

FIG. 8 is a simplified block/network diagram depicting an exemplary embodiment of signal lines for clock regions 304-1, 304-2 and 304-3 of FPGA 300. From a regional buffer 309, signals are driven into an end driven H clock tree of clock region 304-1. Additionally, one or both of end driven H clock trees of clock regions immediately above and below clock region 304-1 may be driven from such regional buffer 309 by using vertical regional clock signal lines 798 and 799 as previously described. Thus, for example, from regional buffer 309, one or more clocking signals, such as two in the above example, may be driven into H clock trees of clock regions 304-1, 304-2 and 304-3. Thus, clock regions 304-1, 304-2 and 304-3 may all be driven by the same regional clock signal, namely, a multi-region clock. Either or both of clock regions 304-2 and 304-3 may be used in conjunction with clock region 304-1, namely, may drive a signal into an adjacent region.

Figure 9:
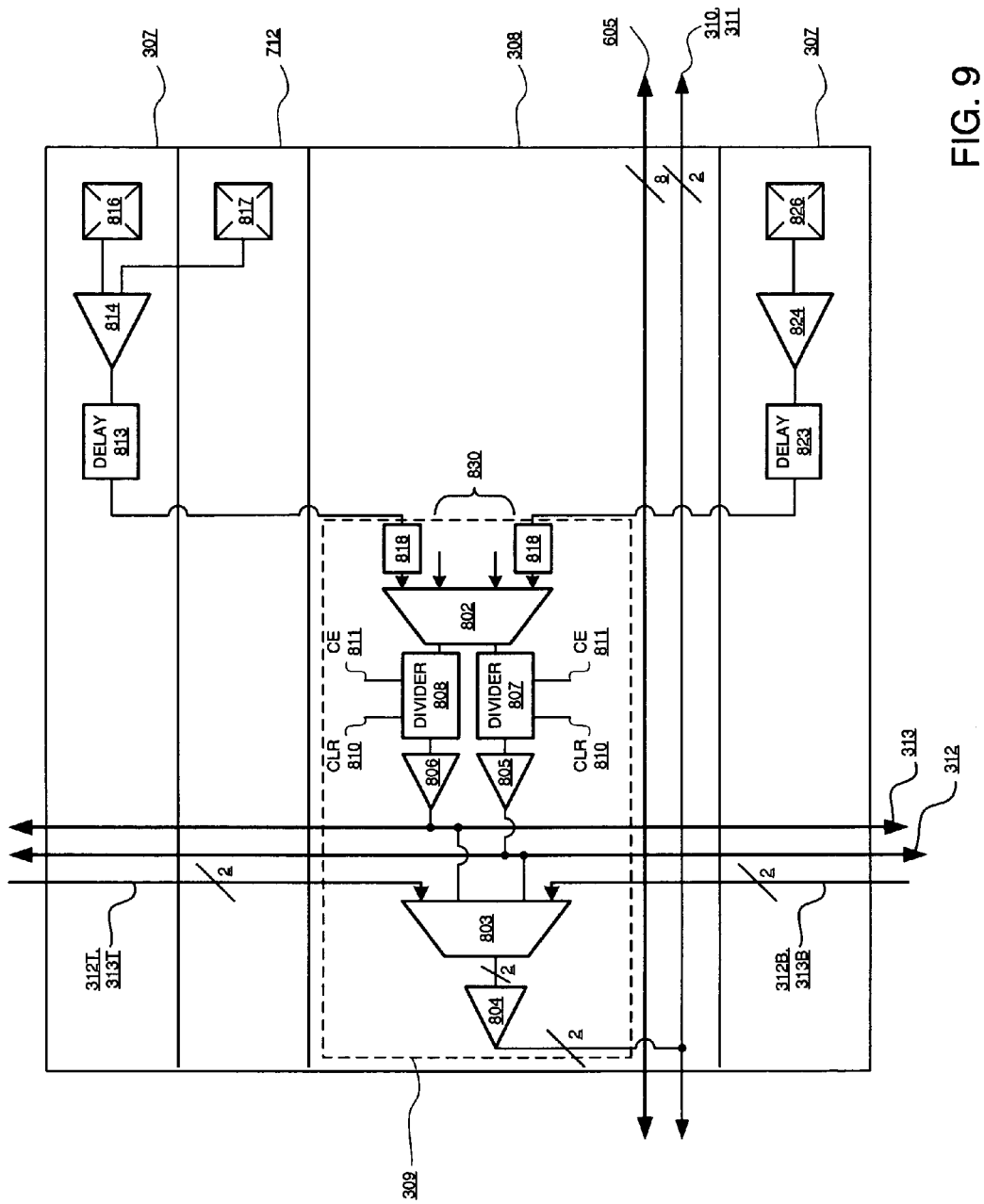
FIG. 9 is a simplified block/schematic diagram depicting an exemplary embodiment of regional buffers coupled to IO Blocks ("IOBs").

FIG. 9 is a simplified block/schematic diagram depicting an exemplary embodiment of regional buffers 309 coupled to an IOB 307 and an IOB 712. Continuing the above example of two regional buffers 309 per hclk IOB tile 308, regional buffers 309 are further described. However, it should be appreciated that fewer or more regional buffers 309 may be employed in an hclk capable IOB 308.

As is known, each IOB includes an IO pad, an input buffer, and optional delay circuitry. Delay circuitry may be voltage controlled delay circuitry, which is described in additional detail in a co-pending U.S. patent application Ser. No. 10/889,248 entitled "Voltage-Controlled Delay Element", by Qi Zhang, et al., filed Jul. 12, 2004, which is incorporated by reference herein in its entirety. In this example, a lower IOB 307 includes an IO pad 826. IO pad 826 is coupled to input buffer 824, the output of which is provided to optional delay circuitry 823. The single-ended output of delay element 823 is provided as an input to multiplexers 802 of regional buffers 309.

Notably, there are two multiplexers 802 for receiving each of the inputs to provide a respective output for cross-barring inputs to selected outputs. In other words, in this example, there are two multiplexers 802 with four inputs each and each of which has its output coupled to dividers 807 and 808. Thus, for example, output from an input buffer 824 may be coupled to either or both of leaf regional clock signal lines 312 and 313 of FIG. 5, and output from input buffer 814 may be coupled to either or both of leaf regional clock signal lines 312 and 313 of FIG. 5. Alternatively, a crossbar switch may replace multiplexers 802.

Two IOBs may be coupled together to support differential signaling into an input buffer. In this example, an IO pad 817 of IOB 712 is coupled to an input port of input buffer 814, and an IO pad 816 of upper IOB 307 is coupled to another input port of input buffer 814. Output of buffer 814 is provided to delay circuitry 813, the differential output of which is provided to differential to single-ended converter 818. The single-ended output of differential to single-ended converter 818 is provided as an input to multiplexers 802. Notably, signaling, and not signal lines, are illustratively shown in FIG. 9. For example, a differential amplifier or buffer 814 actually has two outputs to provide a differential signal. Accordingly, a differential output from delay circuitry 813 is two lines for a differential signal. Furthermore, IOBs may be paired, such as upper IOBs 307 and 712. A pair of IOBs may be referred to as a single input.

Other inputs 830 to multiplexers 802 may include inputs from an interconnect tile or other known interconnects. Additionally, clear signal 810 and clock enable signal 811 may be from an interconnect tile or other known interconnects. For example, clear signal 810 or clock enable signal 811 may be set for an application other than synchronous interfacing. Though clear signals 810 use the same reference number as provided to respective dividers 807 and 808, they may, though need not, be the same signal. Moreover, though clock enable signals 811 use the same reference number as provided to respective dividers 807 and 808, they may, though need not, be the same signal. One or both of dividers 807 or 808 may be set to divide by one to effectively bypass signal frequency division or be set to a positive integer value greater than one for frequency division. An input 830 may be any user designated signal, including without limitation a regional signal to be fanned out using regional buffers 309.

A pair of regional buffers 309 located in hclk IOB tile 308 include multiplexers 802, programmable dividers 807 and 808, buffers 805 and 806, multiplexers 803, and buffers 804, as well as various circuit traces. Buffers 804, 805 and 806 may be CMOS buffers. Each multiplexer 802 has a respective output, which may be obtained from either an upper or a lower coupled IOB or IOB pair output, and these respective outputs from multiplexers 802 are each coupled to dividers. For example, output of delay circuitry 823 may be coupled as an input to divider 807 via one of multiplexers 802, and output of differential to single-ended converter 818 may be coupled as an input to divider 807 via another one of multiplexers 802. A select signal or separate select signals may be provided to multiplexers 802 and 803 for selecting respective outputs thereof. Such select signals are programmably controlled by a user, and thus are not shown in FIG. 9.

Dividers 808 and 807 may be set such that there is no dividing down of an incoming signal's frequency. However, by having a divider as part of a regional buffer 309, a Digital Clock Manager resource of an FPGA does not need to be used to provide a divided clock signal like it does with a global clock resource. Additionally, by including a divider in a regional buffer 309, a divided version of a forwarded clock of a synchronous interface may be obtained for serial-to-parallel conversion, as well as subsequent clocking of parallel data.

Continuing the above example of two leaf regional clock signal lines 312 and 313, output of divider 807 is provided as an input to buffer 805, and output of divider 808 is provided as an input to buffer 806. Output of buffer 806 is provided to drive signals on leaf regional clock signal line 799, and output of buffer 805 is provided to drive signals on leaf regional clock signal line 798. As previously described herein, leaf regional clock signal lines 798 and 799 may extend to upper and lower regional buffers 309. Notably, block 308 of FIG. 5 and FIG. 9 includes blocks 314 and 315 of FIG. 6.

Notably, there are two multiplexers 803 for receiving each set of inputs to provide a respective output for cross-barring inputs to selected outputs responsive to one or more select signals as programmably set by a user. In other words, in this example, there are two multiplexers 803 with six inputs to each and each of which has its output coupled to branch buffers 804. Thus, for example, output from leaf buffer 806 may be coupled to either or both of horizontal branch regional clock signal lines 310 and 311, and output from leaf buffer 805 may be coupled to either or both of horizontal branch regional clock signal lines 310 and 311. Alternatively, a crossbar switch may replace multiplexers 803.

Accordingly, vertical regional clock signal lines 798B and 799B, extending from a lower region, are provided as input to multiplexers 803 of regional buffers 309. Furthermore, vertical regional clock signal lines 798T and 799T, extending from an upper region, are provided as input to multiplexers 803 of regional buffers 309. Other input to multiplexers 803 is each output from buffers 805 and 806. Continuing the above example of a multi-region driven signal, each output from multiplexers 803 is provided to branch buffers 804. Outputs of branch buffers 804 are respectively provided to horizontal branch regional clock signal lines 310 and 311.

Thus, to summarize by way of example, there are: vertical regional clocks for multi-region distribution; branch regional clocks for horizontal distribution; and leaf regional clocks for vertical distribution within a region. Notably, the terms vertical and horizontal are used herein to comport with the drawings illustrating various embodiments. However, it should be appreciated that the terms vertical and horizontal are not meant to limit implementation. Thus, vertical wires may be switched with horizontal wires; and such wires need not be precisely orthogonal to one another, but may be simply generally extend in different directions.

Figure 10:
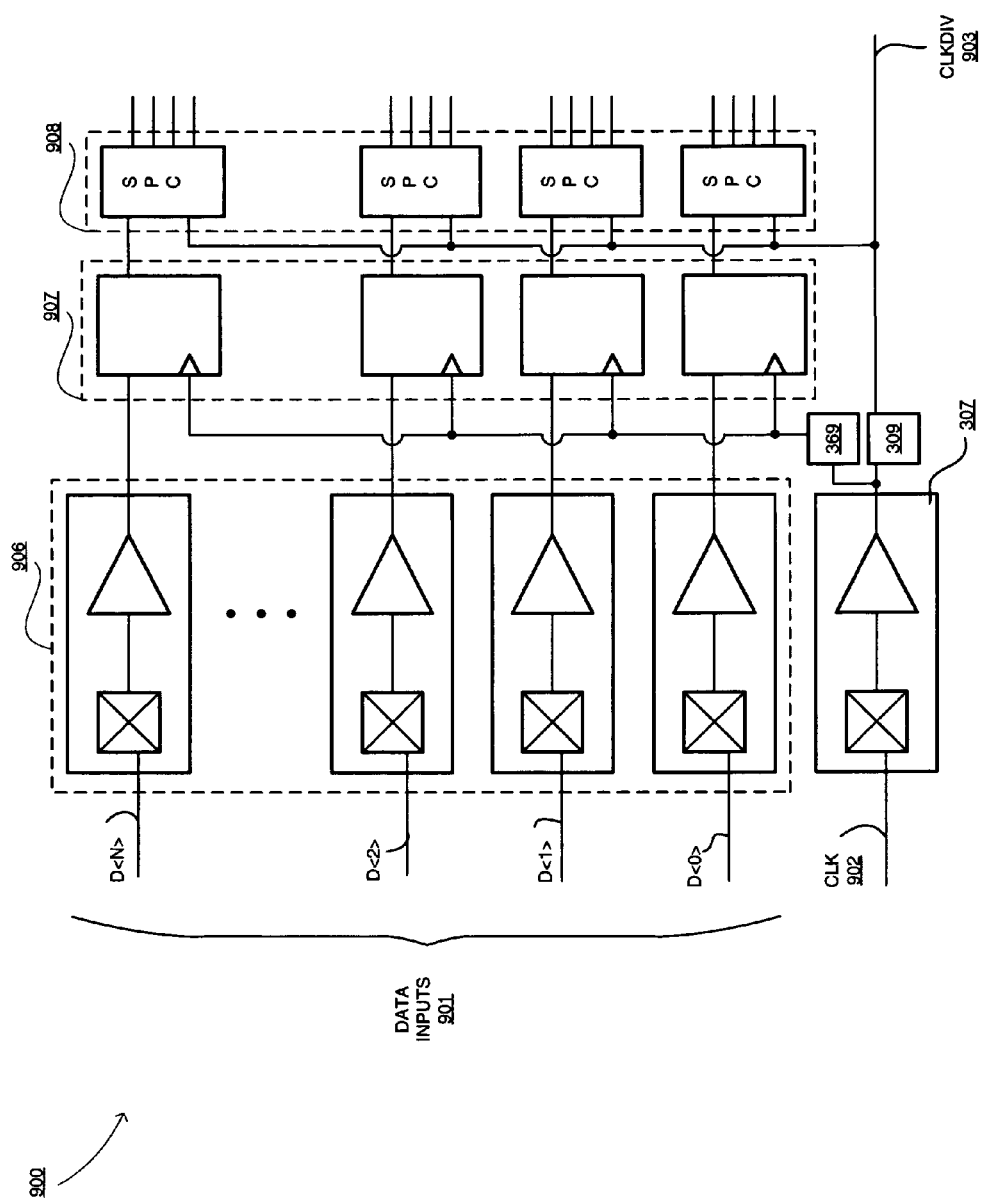
FIG. 10 is a block diagram depicting an exemplary embodiment of a synchronous interface.

FIG. 10 is a block diagram depicting an exemplary embodiment of a synchronous interface 900. There are N data inputs 901, for N a positive integer, which are provided to N respective IOBs 906. Assuming for purposes of clarity that single-ended signaling is used, though differential signaling may be used for an incoming clock signal 902 and data signals 901, N outputs of IOBs 906 may respectively be provided to N data flip-flops 907.

Provided with data inputs 901 is a forwarded source synchronous clock signal 902. Forwarded source synchronous clock signal 902 is input to a regional clock capable IOB 307. The output of IOB 307 is provided to the N data flip-flops 907 as a clock signal input and is provided to a regional buffer 309. Alternatively, the output from IOB 307 may be provided to an input signal distribution buffer 369, as illustratively shown, prior to being provided as a clock signal input to the N data flip-flops 907. Input signal distribution buffer 369 is described in additional detail in a co-pending U.S. patent application entitled "CLOCK SIGNAL-DISTRIBUTION NETWORK FOR AN INTEGRATED CIRCUIT", by Jason R. Bergendahl et al., filed concurrently, which is incorporated by reference herein in its entirety.

The N outputs from data flip-flops 907 are respectively provided to N serial to parallel converters ("SPC") 908. Serial to parallel converters are clocked responsive to an output from regional buffer 309, namely, divided clock signal 903 which is a divided down version of forwarded source synchronous clock signal 902. Accordingly, it should be appreciated that a regional buffer 309 may be used to provide a divided down version of a forwarded clock for a serial to parallel conversion. This divided down version of a forwarded clock signal output from a regional buffer 309 is a regional clock signal distributed on a regional clock network.

Figure 11:
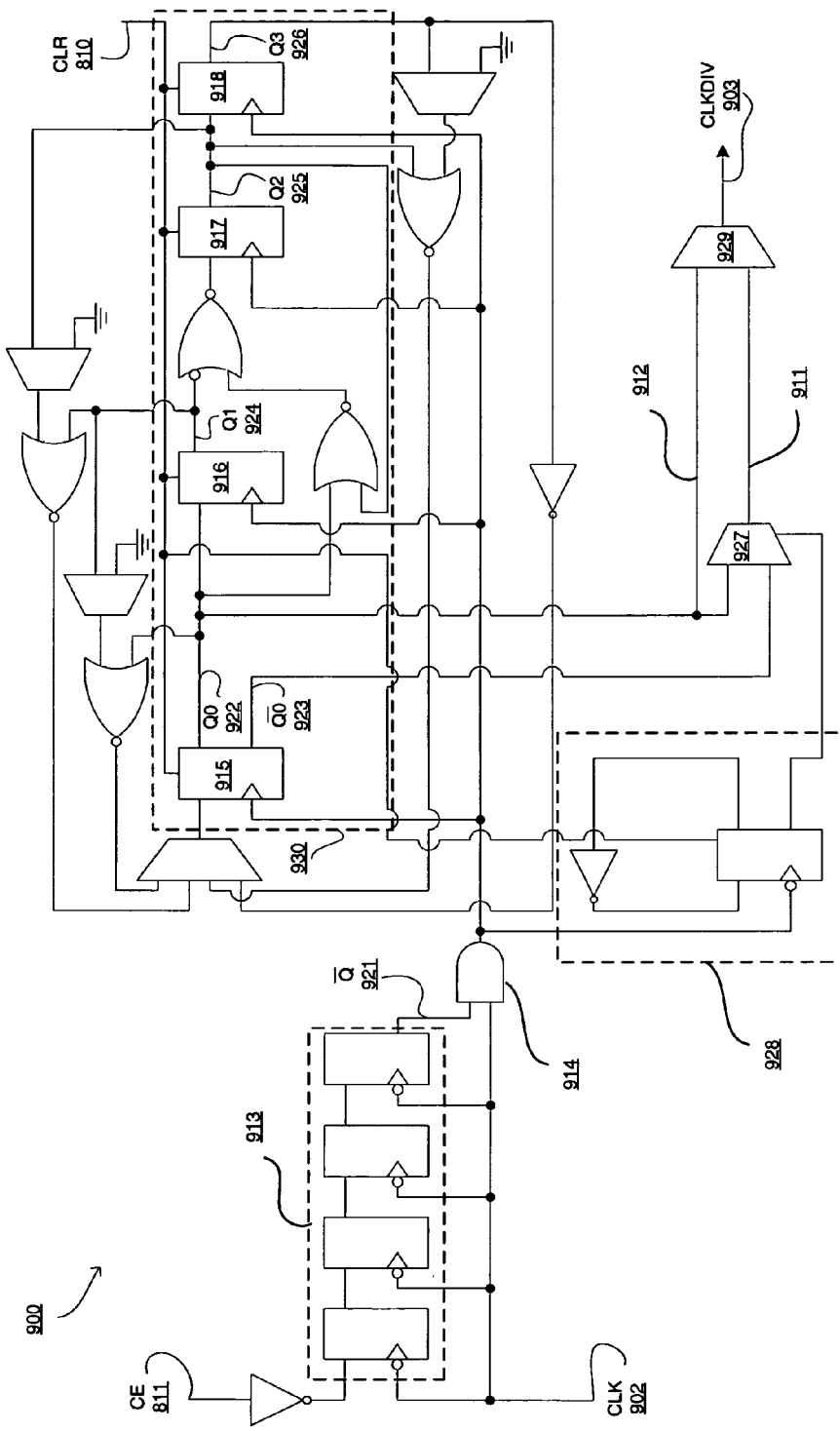
FIG. 11 is a schematic diagram depicting an exemplary embodiment of a programmable divider.

FIG. 11 is a schematic diagram depicting an exemplary embodiment of a programmable divider 900, such as may be implemented for divider 807 or 808 of FIG. 9. A clock enable signal 811 is provided as a data input to a serial chain of flip-flops 913 which are clock responsive to clock signal 902. Output 921 of the serial chain of flip-flops 913 is ANDed with clock signal 902 by an AND gate 914. Output of AND gate 914 is used to clock flip-flops 915, 916, 917 and 918 ("915 through 918"). Flip-flops 915 through 918 are coupled in series to provide a counter 930 with respective outputs Q0 922, Q1 924, Q2 925 and Q3 926.

Flip-flops 915 through 918 are coupled to receive clear signal 810 to respective asynchronous reset input ports of those flip-flops. Clear signal 810 may be used to set or reset counter 930 to a known state. For example, clear signal 810 may be used to set or reset counter 930 to zero or other known state, which facilitates synchronization for in-step division of clock signal 902.

Output from AND gate 914 is further provided to a control select circuit 928 as a clock signal input. Output of control select circuit 928 is provided as a select control signal to a multiplexer 927. Data inputs to multiplexer 927 are signal Q0 922 and its complemented signal Q0_B 923, both of which are outputs from flip-flop 915. Output from multiplexer 927 is provided, along with output Q0 922, as data inputs to a multiplexer 929. Output of multiplexer 929 is a divided clock signal 903. Line 912 input to multiplexer 929 from flip-flop 915 is in this exemplary embodiment a divided version of clock signal 902, which frequency is divided by an integer from 2 to 8. Line 911 input to multiplexer 929 from multiplexer 927 output is in this embodiment a divided by 1 version of clock signal 902. Programmable divider 900 may be programmed with respect to a divisor value for frequency dividing of clock signal 902. The divisor value may be dependent at least in part on whether an incoming signal is a Single Data Rate or a Double Data Rate signal. Notably, the setting of a divisor value is described in additional detail in serial to parallel conversion for source synchronous interfacing as described in a co-pending U.S. patent application Ser. No. 10/919,901 entitled "Multi-Purpose Source Synchronous Interface Circuitry", by Paul T. Sasaki, et al., filed Aug. 17, 2004, which is incorporated by reference herein in its entirety. Additionally, is should be appreciated that a source synchronous interface is implemented without the use of either a Digital Clock Manager or a global clock signal.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners. Headings are provided merely for organizational clarity and are not intended in anyway to limit the scope of the disclosure under them.

What is claimed is:

1. An integrated circuit, comprising:
    a global signal distribution network;
    a first regional signal distribution network and a second regional signal distribution network;
    a regional buffer having an output coupled at an end of the first regional signal distribution network and at an end of the second regional signal distribution network;
    the first regional signal distribution network spanning a first row of adjacent configurable logic blocks of respective adjacent columns of configurable logic blocks;
    the second regional signal distribution network spanning a second row of adjacent configurable logic blocks of the columns of configurable logic blocks different from the first row;
    the regional buffer coupled to a first input/output block;
    the first input/output block being part of a column of input/output blocks bordering the columns of configurable logic blocks at one end thereof;
    the first input/output block being a regional clock capable input/output block;
    the first regional signal distribution network coupled to the regional buffer to receive clock signaling for providing the clock signaling to the first row of configurable logic blocks via the first input/output block; and
    the second regional signal distribution network coupled to the regional buffer to receive the clock signaling for providing the clock signaling to the second row of configurable logic blocks via the first input/output block.

2. The integrated circuit, according to claim 1, wherein the regional buffer is located in a global signal capable input/output block.

3. The integrated circuit, according to claim 1, wherein the first regional signal distribution network comprises a branch signal line having leaf signal lines coupled thereto; and
    wherein the branch signal line is coupled to a leaf signal line of the leaf signal lines via a buffer circuit.

4. The integrated circuit, according to claim 1, wherein:
    the regional buffer is coupled to the second regional signal distribution network via a second input/output block;
    the second input/output block is part of the column of input/output blocks;
    the second input/output block not being regional clock capable; and
    the second input/output block is adjacent to an initial configurable logic block of the configurable logic blocks of the second row.

5. The integrated circuit, according to claim 4, wherein:
    the first regional signal distribution network is coupled to the initial configurable logic block of the first row via a first interconnect tile; and
    the second regional signal distribution network is coupled to the initial configurable logic block of the second row via a second interconnect tile.

6. The integrated circuit, according to claim 1, wherein the first regional signal distribution network is for distributing the clock signaling horizontally across the first row of the configurable logic blocks starting from an initial configurable logic block of the configurable logic blocks of the first row adjacent to the first input/output block and proceeding sequentially to each next one of the configurable logic blocks associated with the first row.

* * * * *